United States Patent [19]
Miyazaki

[11] Patent Number: 5,537,075
[45] Date of Patent: Jul. 16, 1996

[54] SEMICONDUCTOR INTEGRATED CIRCUIT HAVING ISOLATED SUPPLY PATHS FOR CIRCUIT BLOCKS

[75] Inventor: Harutomi Miyazaki, Tokyo, Japan

[73] Assignee: Sony Corporation, Tokyo, Japan

[21] Appl. No.: 355,692

[22] Filed: Dec. 14, 1994

[30] Foreign Application Priority Data

Dec. 17, 1993 [JP] Japan ................................. 5-318431

[51] Int. Cl.$^6$ .................................................. H01L 27/085
[52] U.S. Cl. ......................... 327/566; 257/371; 348/312; 377/61
[58] Field of Search ................................... 327/566, 565, 327/564, 40, 44, 534, 538, 542, 543; 257/371, 245, 246, 248; 348/312, 392, 901; 377/61, 63, 62

[56] References Cited

U.S. PATENT DOCUMENTS

| | | | |
|---|---|---|---|
| 4,096,397 | 6/1978 | Dreiling | 327/44 |
| 4,468,574 | 8/1984 | Engeler et al. | 257/371 |
| 5,311,048 | 5/1994 | Takahashi et al. | 257/368 |
| 5,323,043 | 6/1994 | Kimura et al. | 257/371 |
| 5,386,135 | 1/1995 | Nakazato et al. | 257/369 |
| 5,399,915 | 3/1995 | Yahata | 327/108 |

*Primary Examiner*—Timothy P. Callahan
*Assistant Examiner*—Terry L. Englund
*Attorney, Agent, or Firm*—Hill, Steadman & Simpson

[57] ABSTRACT

Circuit blocks to which reference clock signals with different frequencies are input can be fabricated on the same substrate. A supply path of a supply voltage applied to a source region of a first PMOSFET and a first N-type well region, and a supply path of a supply voltage applied to a source region of a second PMOSFET and a second N-type well region, are isolated from each other by the first and second N-type well regions, respectively. A supply path of a supply voltage applied to a source region of a first NMOSFET and a first P-type well region, and a supply path of a supply voltage applied to a source region of a second NMOSFET and a second P-type well region, are isolated from each other by the first and second P-type well regions, respectively. The respective isolation of the supply voltage supplied path ensures that substrate potential fluctuations caused by the different frequencies do not result in a beat (a wave form distortion) being present on outputs of the circuit blocks.

1 Claim, 15 Drawing Sheets

F I G. 12A
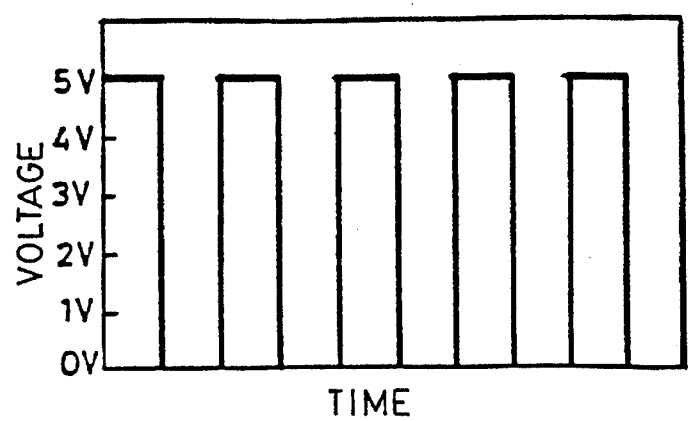
F I G. 12C
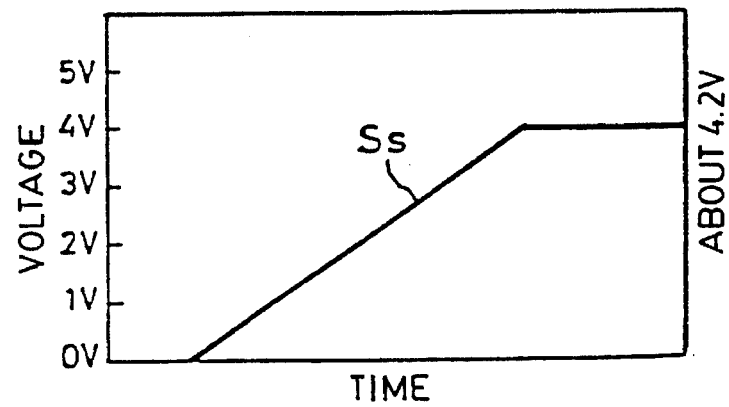

SEMICONDUCTOR INTEGRATED CIRCUIT HAVING ISOLATED SUPPLY PATHS FOR CIRCUIT BLOCKS

BACKGROUND OF THE INVENTION

The present invention relates to a semiconductor integrated circuit in which a plurality of circuit blocks (digital circuits) to which reference clock signals with different frequencies are input are fabricated on the same semiconductor substrate. More particularly, this invention relates to a semiconductor integrated circuit for use when a timing generator and a synchronizing (sync) signal generator used to generate a CCD (charge coupled device) image sensor drive pulse are fabricated on the same semiconductor chip.

Digital circuits to which reference clock signals with different frequencies are input, e.g., a timing generator and a sync signal generator used to generate a CCD image sensor drive pulse, are fabricated on respective semiconductor substrates and are mounted on a CCD image sensor set (video camera circuit board) as two semiconductor chips.

In order to miniaturize the CCD image sensor, efforts are made to form the timing generator and the sync signal generator as one semiconductor chip.

An arrangement in which a timing generator and a sync signal generator are fabricated as one semiconductor chip will be described with reference to a cross-sectional view of FIG. 1 and a circuit diagram in FIG. 2. In FIGS. 1 and 2, in order to facilitate the understanding, arrangements of a timing signal generator 101 and a sync signal generator 102 are illustrated as CMOS (complementary metal oxide semiconductor) inverters 103 and 104 which are elements of the respective generators 101 and 102.

As shown in FIG. 1, first and second N-type well regions 112An, 112Bn are formed on a P-type silicon substrate 111, for example, at its portion in which the timing generator 101 and the sync signal generator 102 are formed. First and second P-channel MOSFETs (referred to hereinafter as "first and second PMOSFETs") 113, 115 are formed on the N-type well regions 112An, 112Bn. First and second N-channel MOSFETs (referred to hereinafter as "first and second NMOSFETs") 114, 116 are formed on the P-type silicon substrate 111, thereby forming the timing generator 101 which includes the first CMOS inverter 103 composed of the first PMOSFET 113 and the first NMOSFET 114 and the sync signal generator 102 which includes the second CMOS inverter 104 composed of the second PMOSFET 115 and the second NMOSFET 116.

As shown in FIG. 2, an input voltage Vin1 is applied to gate electrodes 113G, 114G of the first PMOSFET 113 and the first NMOSFET 114 in the first CMOS inverter 103. A supply voltage VDD1 (=+5 V) is applied to a source electrode 117s which contacts a source region 113S of the first PMOSFET 113. A drain electrode 117d which contacts a drain region 113D of the first PMOSFET 113 and a drain electrode 118d which contacts a drain region 114D of the first NMOSFET 114 are connected commonly and an output voltage Vout1 is obtained from this common terminal.

An input voltage Vin2 is applied to gate electrodes 115G, 116G of the second PMOSFET 115 and the second NMOSFET 116 in the second CMOS inverter 104. A supply voltage VDD2 is applied to a source electrode 119s which contacts the source region 115S of the second PMOSFET 115. A drain electrode 119d which contacts the drain region 115D of the second PMOSFET 115 and a drain electrode 120d which contacts the drain region 116D of the second NMOSFET 116 are commonly connected and an output voltage Vout2 is obtained from this common terminal.

A ground potential VSS (=0 V) is applied to source electrodes 118s and 120s which contact the source regions 114S and 116S of the respective NMOSFETs 114, 116. Simultaneously, the ground potential VSS is applied to the silicon substrate 111 as a substrate potential. Specifically, the same supply potential (ground potential VSS) is applied to the source regions 114S, 116S of the respective NMOSFETs 114, 116.

In the semiconductor integrated circuit, when the potential Vin1 input to the first CMOS inverter 103, for example, goes to a high level so that the first NMOSFET 114 is operated, the substrate potential VSS is fluctuated in accordance with charges (electrons in this case) induced under the gate electrode 114G of the first NMOSFET 114 from the silicon substrate 111. A timing at which the substrate potential Vss is fluctuated is determined by the change of level of the input voltage Vin1, i.e. the frequency of the reference clock signal supplied to the timing generator 101.

The fluctuation of the substrate potential VSS is transmitted through the silicon substrate 111 to the second CMOS inverter 104, so that a gate bias potential and a source voltage in the second NMOSFET 116 is fluctuated. Consequently, as shown in FIG. 3B, a waveform distortion a (so-called beat) b is caused in the output potential output from the second CMOS inverter 104 due to potential interference.

This phenomenon occurs also in the first CMOS inverter 103. As a result, as shown in FIG. 3A, the beat b occurs also in the output potential output from the first CMOS inverter 103. This phenomenon of the beat b occurs because operation timings of the first CMOS inverter 103 and the second CMOS inverter 104 are different, i.e., a frequency (=28 MHz) of a reference clock signal supplied to the timing generator 101 including the first CMOS inverter 103 and a frequency (=17 MHz) of a reference clock signal supplied to the sync signal generator 102 including the second CMOS inverter 104 are different from each other.

The beat b exerts a bad influence on the CCD image sensor and is superimposed on video signal as a noise. As a result, when the cameraman takes a picture of a white object by a video camera, as shown in FIG. 4 many oblique dark stripe patterns c are produced in a picture reproduced on a monitor so that a picture quality of a reproduced picture is deteriorated considerably.

Therefore, a plurality of circuit blocks (the timing generator 101 and the sync signal generator 102 in this example) to which the input reference clock signals with different frequencies are input could not be fabricated on the same substrate 111. Thus, the CCD image sensor could not be miniaturized from a circuit mounting standpoint.

SUMMARY OF THE INVENTION

In view of the aforesaid aspect, it is an object of the present invention to provide a semiconductor integrated circuit in which circuit blocks to which reference clock signals with different frequencies are input can be fabricated on the same semiconductor substrate.

It is another object of the present invention to provide a semiconductor integrated circuit in which a timing generator and a sync signal generator used to generate a CCD image sensor drive pulse can be fabricated on the same substrate without producing a beat in the output signals of the timing generator and the sync signal generator so that a picture quality of a reproduced picture can be prevented from being deteriorated.

It is a further object of the present invention to provide a semiconductor integrated circuit in which a timing generator and a sync signal generator used to generate a CCD image sensor drive pulse can be fabricated on the same semiconductor substrate and wherein electronic equipment having a CCD image sensor mounted thereon can be miniaturized from a circuit mounting standpoint.

According to an aspect of the present invention, there is provided a semiconductor integrated circuit which is comprised of a semiconductor substrate, a plurality of circuit blocks formed on the semiconductor substrate, the respective circuit blocks having operation timings determined by frequencies of input reference clock signals, a circuit for inputting input reference clock signals to the plurality of circuit blocks, the input reference clock signals having different frequencies, and supply paths for supplying a supply voltage applied to the circuit blocks, the supply paths being isolated from each other.

BRIEF DESCRIPTION OF THE DRAWINGS

FIGS. 3A and 3B are diagrams of waveforms of output signals output from the semiconductor integrated circuit wherein FIG. 3A is a diagram of a waveform of an output signal output from a timing generator, and FIG. 3B is a diagram of a waveform of an output signal output from a sync signal generator, respectively;

FIGS. 8A and 8B are diagrams of waveforms of output signals output from the semiconductor integrated circuit according to the first embodiment of the present invention, wherein FIG. 8A is a diagram of a waveform of an output signal output from a timing generator, and FIG. 8B is a diagram of a waveform of an output signal output from a sync signal generator, respectively;

FIGS. 12A to 12C are diagrams of waveforms of output signals output from the semiconductor integrated circuit according to the first modified example of the present invention, in which FIG. 12A is a diagram of a waveform of an output signal output from a CMOS inverter, FIG. 12B is a diagram of a waveform of an output signal output from an operational amplifier circuit used when an ordinary circuit arrangement is adopted, and FIG. 12C is a diagram of a waveform of an output signal output from the operational amplifier circuit according to the first modified example, respectively;

DETAILED DESCRIPTION OF THE PREFERRED EMBODIMENTS

A semiconductor integrated circuit according to the embodiments of the present invention will be described below with reference to FIGS. 5 to 15.

Figure 5:
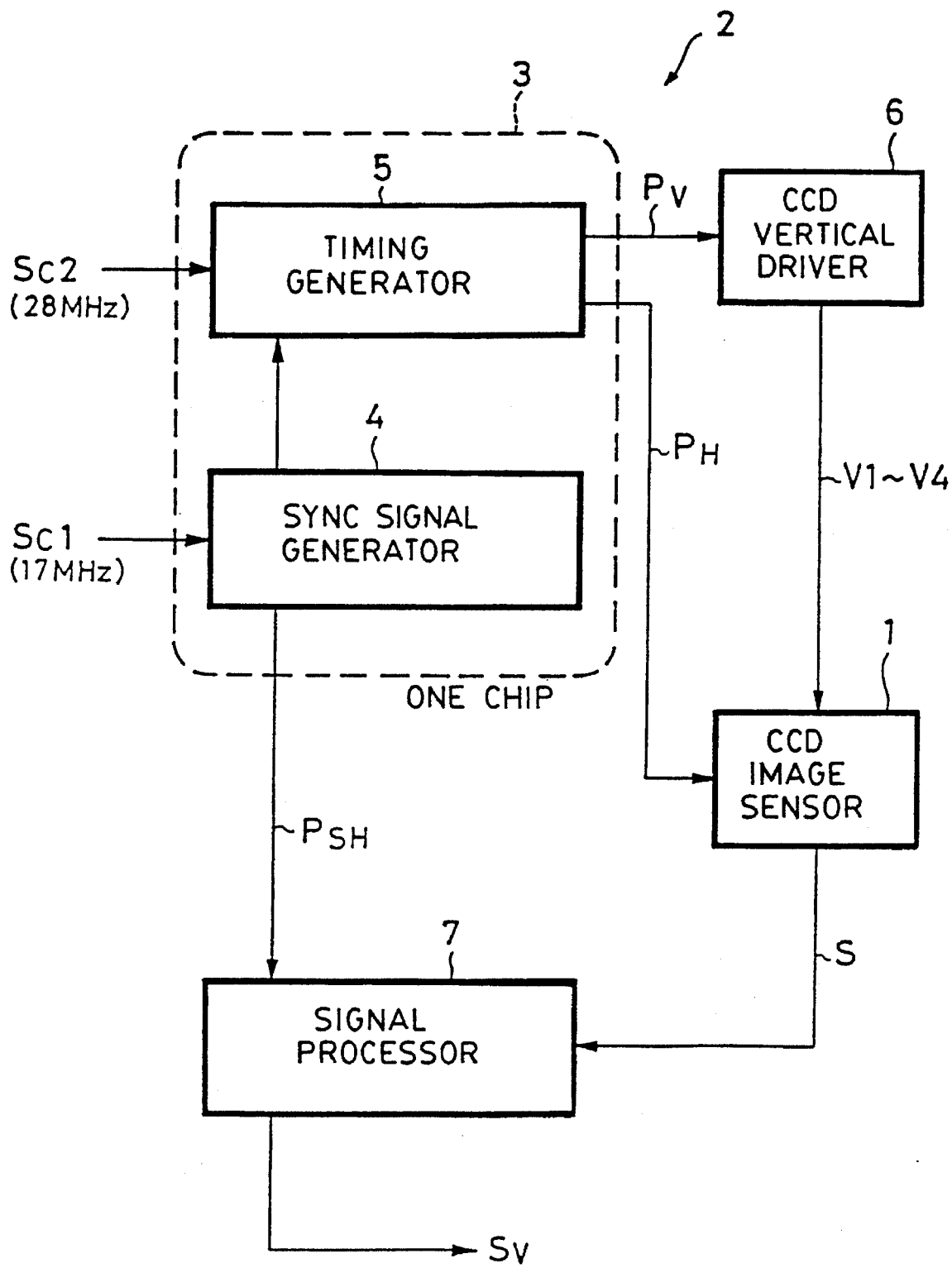
FIG. 5 is a block diagram showing an example of a circuit system of a video camera in which a semiconductor integrated circuit according to a first embodiment of the present invention is incorporated.

As shown in FIG. 5, a semiconductor integrated circuit according to this embodiment is applied to a video camera circuit system 2 having a CCD image sensor 1 mounted thereon, particularly a circuit 3 for generating a drive pulse used by the CCD image sensor 1 to transfer a charge.

The circuit 3 is composed of a sync signal generator 4 for generating a sync signal based on the input of a first clock signal Sc1 having a frequency of 17 MHz. A timing generator 5 is also provided for generating a vertical transfer clock signal $P_v$, and a horizontal transfer pulse $P_H$ based on the sync signal supplied thereto from the sync signal generator 4. A second clock signal Sc2 having a frequency of 28 MHz is input to the timing generator 5. The sync signal generator 4 outputs a timing signal $P_{SH}$ used in signal processing (e.g., sampling and holding) to the signal processor 7.

The video camera circuit system 2 includes a CCD vertical driver 6 and a signal processor 7 in addition to the above-mentioned circuit 3. The CCD vertical driver 6 generates 4-phase vertical transfer pulses V1 to V4 with different phases based on the input of the vertical transfer clock signal $P_V$ supplied thereto from the timing generator 5 when a vertical register transfers charges in the vertical direction. The CCD image sensor 1 is driven by the 4-phase vertical transfer pulses V1 to V4.

The 4-phase vertical transfer pulses V1 to V4 are supplied to a vertical transfer electrode group in which four vertical transfer electrodes forming one set are formed on the vertical register of the CCD image sensor 1, whereby a signal charge read out to the vertical register from photosensor portions (e.g., composed of pn-junction photodiodes) arranged on the CCD image sensor 1 in a matrix fashion is sequentially transferred to the vertical direction, i.e., to the horizontal register side at the unit of rows.

The horizontal transfer pulses $P_H$ output from the timing generator 5 are 2-phase pulse signals of opposite phases. The 2-phase horizontal transfer pulses $P_H$ are alternately supplied to horizontal transfer electrode groups formed on the horizontal register, i.e., horizontal transfer electrode groups composed by arranging many sets of horizontal transfer electrodes in the lateral direction, each set being composed of two horizontal transfer electrodes at every set. Thus, the signal charge sequentially transferred from the vertical register at the unit of rows is sequentially transferred to the horizontal direction, i.e., an output circuit (e.g., charge-voltage conversion portion) side. Then, the signal charge transferred from the horizontal register is successively converted by an output circuit portion into an electrical signal (voltage signal) and supplied through a buffer circuit to a signal processor 7 of the next stage.

The signal processor 7 incorporates a sample and hold circuit and various circuits for converting a signal component extracted by the sample and hold circuit to a video signal, though not shown. In particular, the sample and hold circuit extracts only a signal component of an image signal S input thereto from the CCD image sensor 1 based on the timing signal $P_{SH}$ supplied thereto from the sync signal generator 4. The signal component extracted by the sample and hold circuit is processed by the signal processor 7 in some suitable signal processing fashion, such as aperture correction, gamma correction or the like, and is delivered from an output terminal of the signal processor 7 as a reproduced video signal Sv.

The semiconductor integrated circuit according to the embodiment of the present invention is constructed such that the sync signal generator 4 and the timing generator 5 are formed on the same semiconductor substrate, and are then assembled into a single semiconductor chip.

Figure 6:
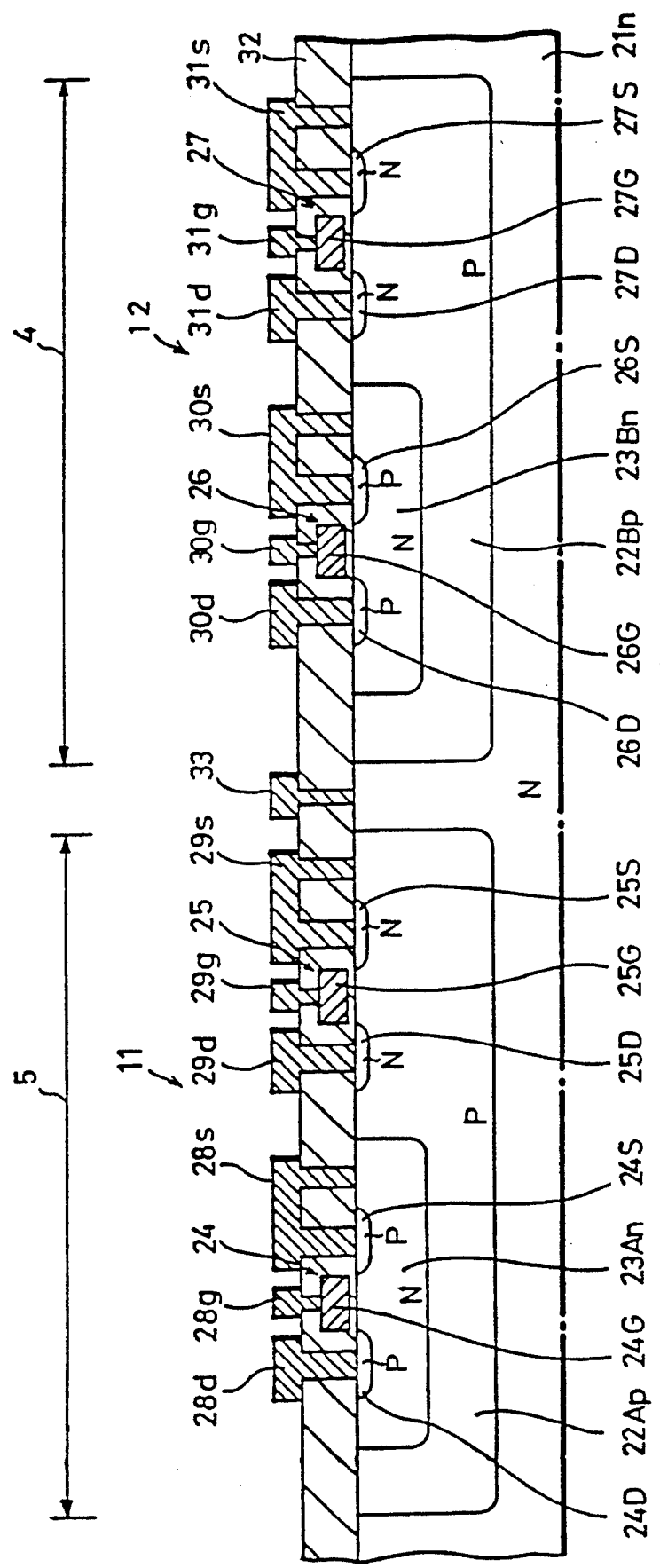
FIG. 6 is a cross-sectional view showing an arrangement of a main portion of the semiconductor integrated circuit according to the first embodiment of the present invention.
Figure 7B:
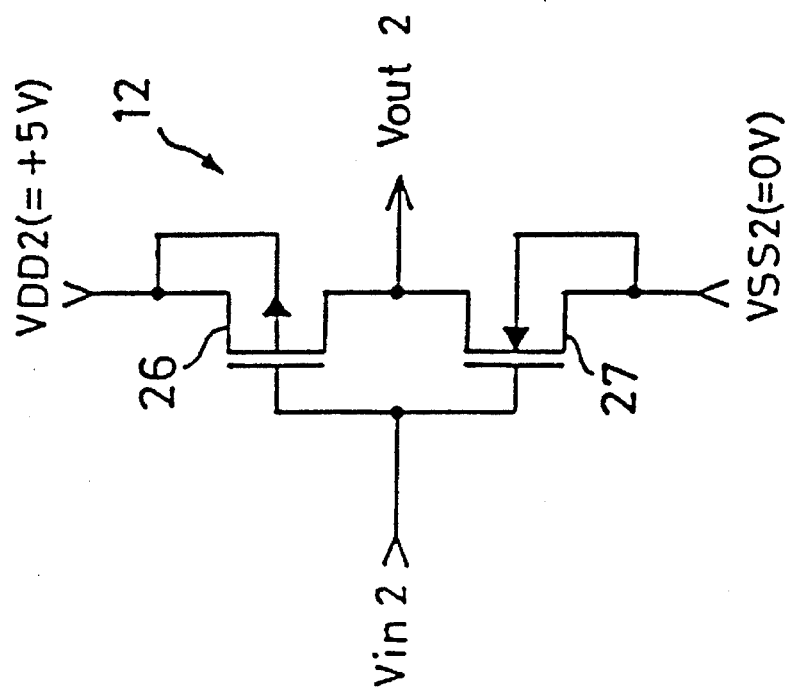
FIG. 7 is a circuit diagram showing connections for the semiconductor FETs illustrated in FIG. 6.
Figure 7A:
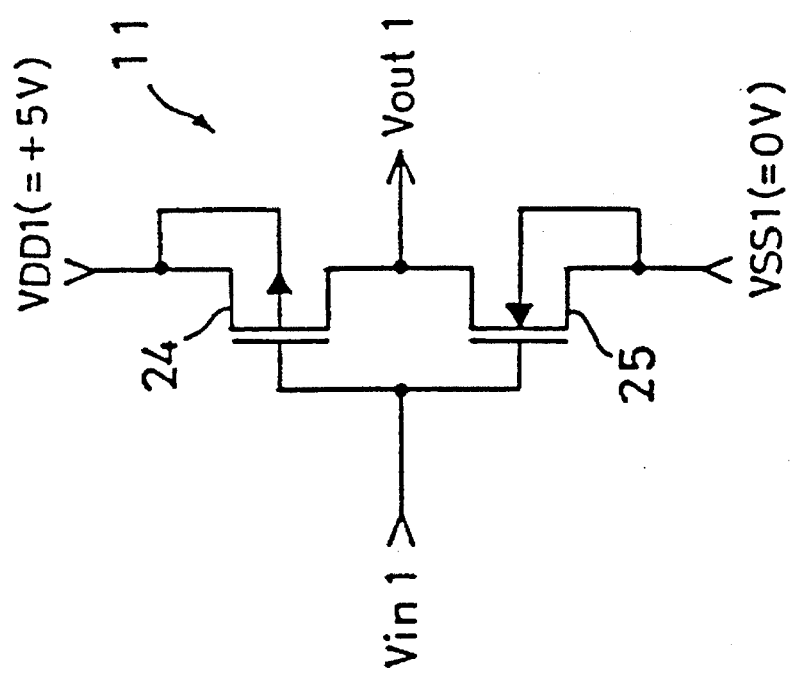

An arrangement of the semiconductor integrated circuit according to the embodiment of the present invention will be described below with reference to a cross-sectional view of FIG. 6 and circuits of FIG. 7. In FIGS. 6 and 7, in order to understand the present invention more clearly, the arrangements of the timing generator 5 and the sync signal generator 4 are illustrated as CMOS inverters 11, 12 which are elements of the respective generators 5 and 4.

As shown in FIG. 6, a P-type well region (referred to hereinafter as "first P-type well region") 22Ap is formed on an N-type silicon substrate 21n at its portion where the timing generator 5 is formed. A P-type well region (referred to hereinafter as "second P-type well region") 22Bp is formed on the N-type silicon substrate 21 at its portion where the sync signal generator 4 is formed. The first and second P-type well regions 22Ap and 22Bp are isolated from each other from a plane standpoint.

The first P-type well region 22Ap includes an N-type well region (referred to hereinafter as "first N-type well region") 23An formed so as to be included on the plane region by the first P-type well region 22Ap. The second P-type well region 22Bp includes an N-type well region (referred to hereinafter as "second N-type well region") 23Bn formed so as to be included on the plane region by the second P-type well region 22Bp.

In the first P-type well region 22Ap, a P channel MOSFET (referred to hereinafter as "first PMOSFET") 24 composed of a P-type source region 24S, a P-type drain region 24D each formed by implanting ions of boron (B), for example, and a gate electrode 24G formed of a polycrystalline silicon layer, a tungsten polycide layer or the like is formed in the first N-type well region 23An. An N channel MOSFET (referred to hereinafter as "first NMOSFET") 25 composed of an N-type source region 25S, an N-type drain region 25D each formed by implanting ions of phosphorus (P) and a gate electrode 25G formed of a polycrystalline silicon layer, a tungsten polycide layer or the like is formed on other regions than the first N-type well region 23An, thereby forming the timing generator 5 which includes the first CMOS inverter 11 composed of the first PMOSFET 24 and of the first NMOSFET 25.

In the second P-type well region 23Bp, a P channel MOSFET (referred to hereinafter as "second PMOSFET") 26 composed of a P-type source region 26S, a P-type drain region 26D each formed by implanting ions of boron (B) and a gate electrode 26G formed of a polycrystalline silicon layer, a tungsten polycide layer or the like is formed in the second N-type well region 23Bn. An N channel MOSFET (referred to hereinafter as "second NMOSFET") 27 composed of an N-type source region 27S, an N-type drain region 27D each formed by implanting ions of phosphorus (P) and a gate electrode 27G formed of a polycrystalline silicon layer, a tungsten polycide layer or the like is formed on other regions than the second N-type well region 23Bn, thereby forming the sync signal generator 4 which includes a second CMOS inverter 12 composed of the second PMOSFET 26 and of the second NMOSFET 27.

As shown in FIGS. 6 and 7, an input voltage Vin1 is applied to the gate electrodes 24G and 25G of the first PMOSFET 24 and of the first NMOSFET 25 in the first CMOS inverter 11. A supply voltage VDD1 (=+5 V) is applied to a source electrode 28s which commonly contacts the source region 24S of the first PMOSFET 24 and the first N-type well region 23An. A supply voltage VSS1 (=0 V) is supplied to a source electrode 29s which commonly contacts the source region 25S of the first NMOSFET 25 and the first P-type well region 22Ap. A drain electrode 28d which contacts the drain region 24D of the first PMOSFET 24 and a drain electrode 29d which contacts the drain region 25D of the first NMOSFET 25 are connected commonly, and an output voltage Vout1 is obtained from this common terminal.

An input voltage Vin2 is applied to the gate electrodes 26G and 27G of the second PMOSFET 26 and the second NMOSFET 27 in the second CMOS inverter 12. A supply voltage VDD2 (=+5 V) is applied to a source electrode 30s which commonly contacts the source region 26S of the second PMOSFET 26 and the second N-type well region 23Bn. A supply voltage VSS2 (=0 V) is applied to a source electrode 31s which commonly contacts the source region 27S of the second NMOSFET 27 and the second P-type well region 22Bp. A drain electrode 30d which contacts the drain region 26D of the second PMOSFET 26 and the drain electrode 31d which contacts the drain region 27D of the second NMOSFET 27 are connected commonly and an output voltage Vout2 is obtained from this common terminal.

The respective source electrodes (28s to 31s) and the respective drain electrodes (28d to 31d) are formed by patterning Al interconnection layers in a desired plane shape, respectively. Deriving electrodes (28g to 31g) formed of Al interconnection layers are formed on the respective gate electrodes (24G to 27G) as shunt electrode or deriving electrodes. The source electrodes (28s to 31s), the drain electrodes (28d to 31d) and the deriving electrodes (28g to 31g) are insulated from the silicon substrate 21n by an insulating layer 32 made of an SiO$_2$ layer, for example, except a contact portion with the silicon substrate 21n.

According to this embodiment, in the silicon substrate 21n, an electrode 33 for applying a substrate potential (e.g., ground potential) to the silicon substrate 21n is formed on a region (separate region) between the first P-type well region 22Ap and the second P-type well region 22Bp.

Specifically, according to this embodiment, a path in which the supply voltage VDD1 applied to the source region 24S of the first PMOSFET 24 and the first N-type well region 23An is supplied and a path in which the supply voltage VDD2 applied to the source region 26S of the second PMOSFET 26 and the second well region 23Bn is supplied are isolated from each other. Further, a path in which the supply voltage VSS1 applied to the source region 25S of the first NMOSFET 25 and the first P-type well region 22Ap is supplied and a path in which the supply voltage VSS2 applied to the source region 27S of the second NMOSFET 27 and the second P-type well region 22Bp is supplied are isolated from each other.

Therefore, when the potential Vin1 input to the first CMOS inverter 11, for example, goes to a high level so that the first NMOSFET 25 is operated, the gate bias potential VSS1 is fluctuated in accordance with charges (electrons in this case) induced under the gate electrode 25G of the first NMOSFET 25 from the first P-type well region 22Ap. A timing at which the gate bias potential VSS1 is fluctuated is determined by the change of level of the input voltage Vin1, i.e., the frequency (=28 MHz) of the reference clock signal Sc2 supplied to the timing generator 5 in this embodiment.

Even though the gate bias potential VSS1 in the timing generator 5 is fluctuated, a bad influence is not exerted on the sync signal generator 4 side by such fluctuation. Specifically, the reason for this is that the first NMOSFET 25 of the first CMOS inverter 11 which is the element of the timing generator 5 is isolated in potential from the silicon substrate 21n by the first N-type well region 22Ap and that the second NMOSFET 27 of the second CMOS inverter 12 which is the element of the sync signal generator 4 is isolated in potential from the silicon substrate 21n by the second N-type well region 22Bp. In addition, since the gate bias potential VSS2 in the second NMOSFET 27 of the second CMOS inverter 12 is fixed to the VSS2 (supply potential applied through the source electrode 31s) which is a potential different from the gate bias potential VSS1 of the first NMOSFET 25 in the first CMOS inverter 11, the second CMOS inverter 12 (i.e., sync signal generator 4) can be prevented from being affected by a potential interference due to the fluctuation of the supply voltage of the first CMOS inverter 11 (i.e., timing generator 5).

Similarly, even though the gate bias voltage VSS2 of the second NMOSFET 27 in the second CMOS inverter 12 is fluctuated in response to the frequency (=17 MHz) of the reference clock signal Sc1 input to the sync signal generator 4, the timing generator 5 side can be prevented from being affected by such fluctuation of the gate bias voltage VSS2. Therefore, the timing generator 5 can be prevented from being affected by a potential interference due to the fluctuation of the supply voltage of the sync signal generator 4.

Since the silicon substrate 21n is applied with ground potential through the electrode 33, a potential neutral region is produced at a pn-junction portion among the first and second P-type well regions 22Ap, 22Bp and the silicon substrate 21n. Owing to the existence of the neutral region, the first P-type well region 22Ap and the second P-type well region 22Bp are isolated from each other from a potential standpoint, i.e., the sync signal generator 4 and the timing generator 5 are isolated from each other from a potential standpoint, whereby a potential interference between the timing generator 5 and the sync signal generator 4 can be removed completely.

Figure 8B:
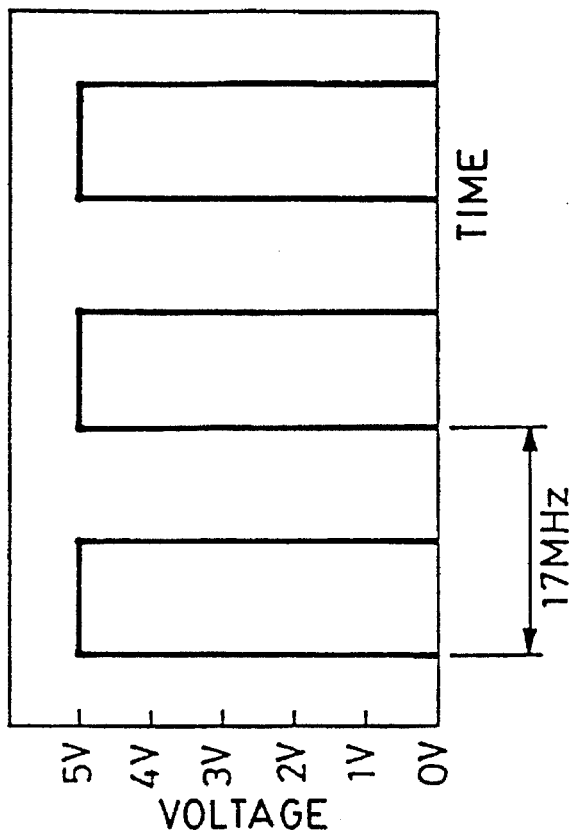
Figure 8A:
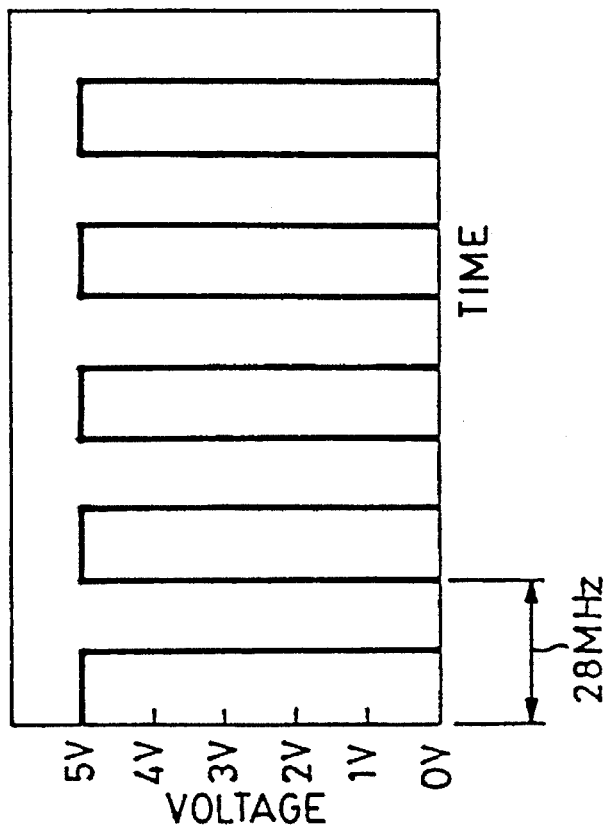

As described above, in the semiconductor integrated circuit according to this embodiment, a beat generated in accordance with the fluctuation of the voltage can be prevented from occurring in the output signal from the timing generator 5 and the output signal from the sync signal generator 4. Therefore, as shown in FIGS. 8A and 8B, the timing generator 5 and the sync signal generator 4 can output output signals of desired waveforms independently. Thus, the timing generator 5 and the sync signal generator 4 to which the reference clock signals SC2, SC1 with the different frequencies are input can be fabricated on the same silicon substrate 21n and mounted on the set (e.g., video camera circuit board) of the CCD image sensor 1 as one semiconductor chip, which can miniaturize an electronic equipment unit (e.g., video camera) having the CCD image sensor 1 mounted thereon from a circuit mount standpoint.

Figure 1:
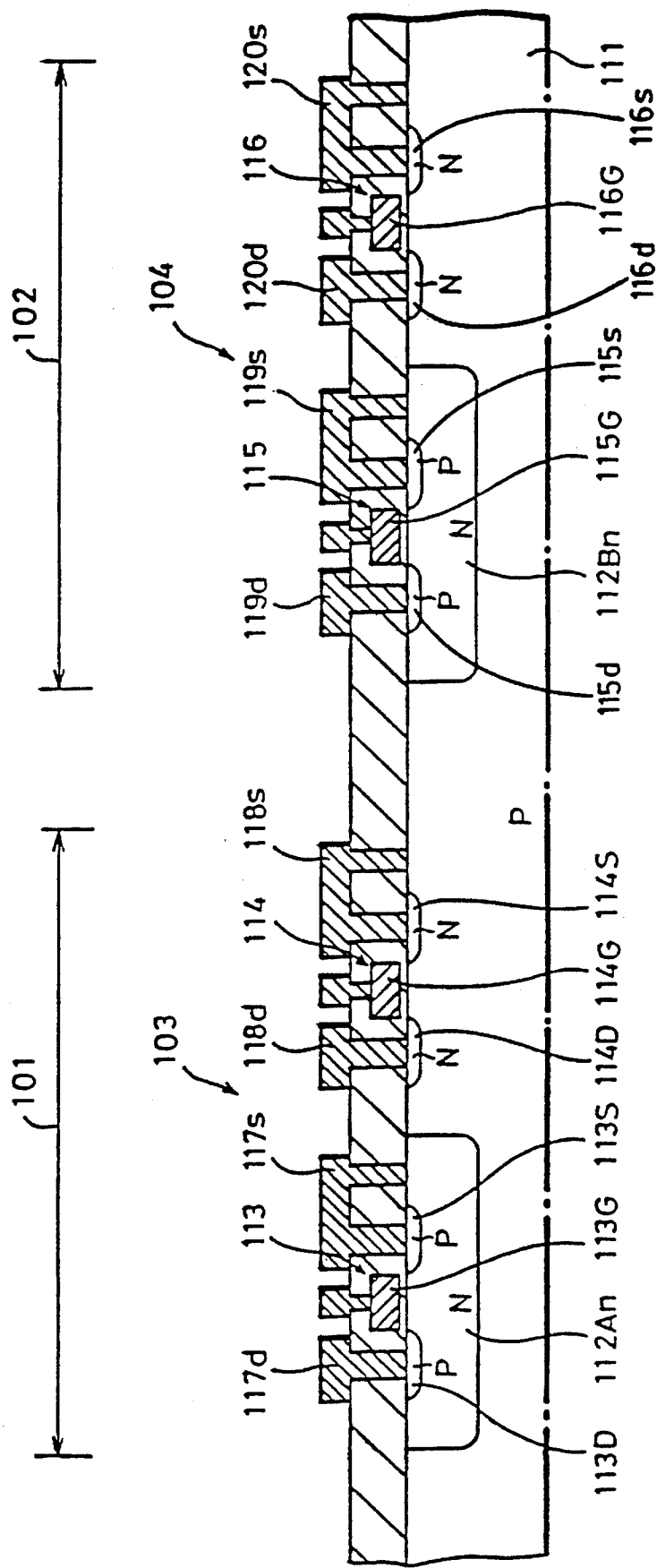
FIG. 1 is a cross-sectional view showing an arrangement of a main portion of a semiconductor integrated circuit.
Figure 2:
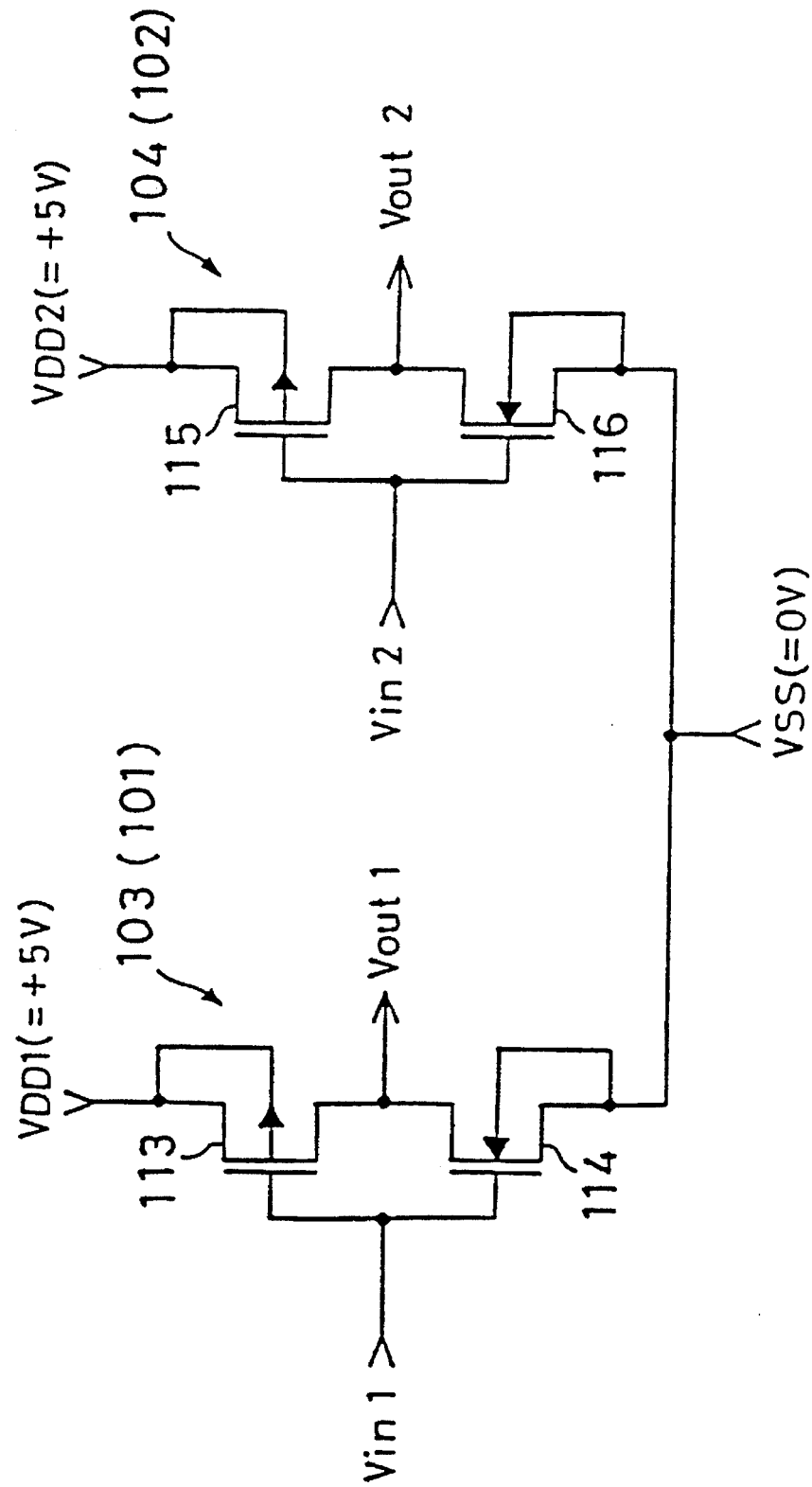
FIG. 2 is a circuit diagram showing a main portion of the semiconductor integrated circuit shown in FIG. 1.
Figure 3B:
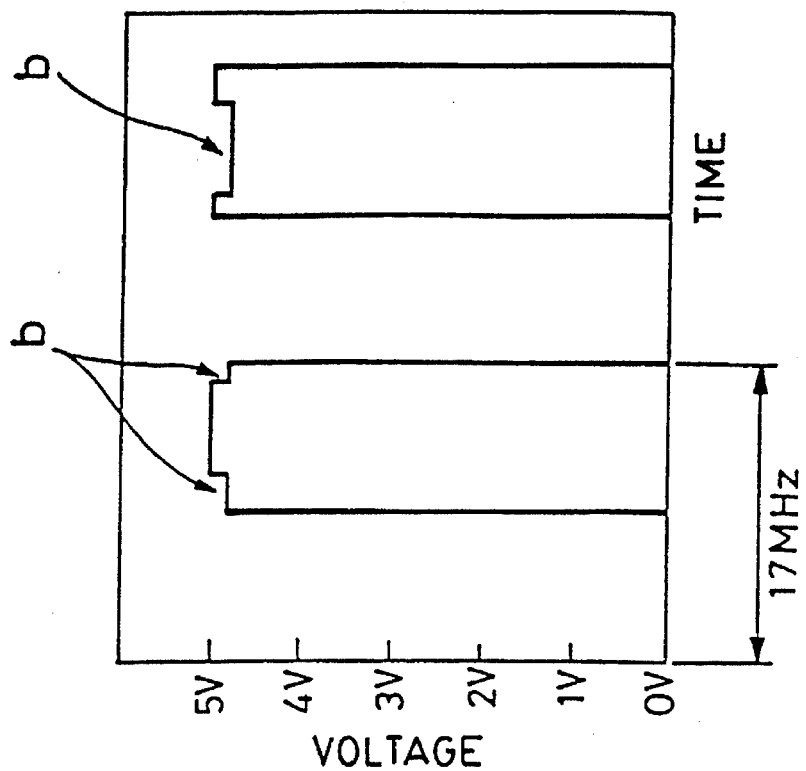
Figure 3A:
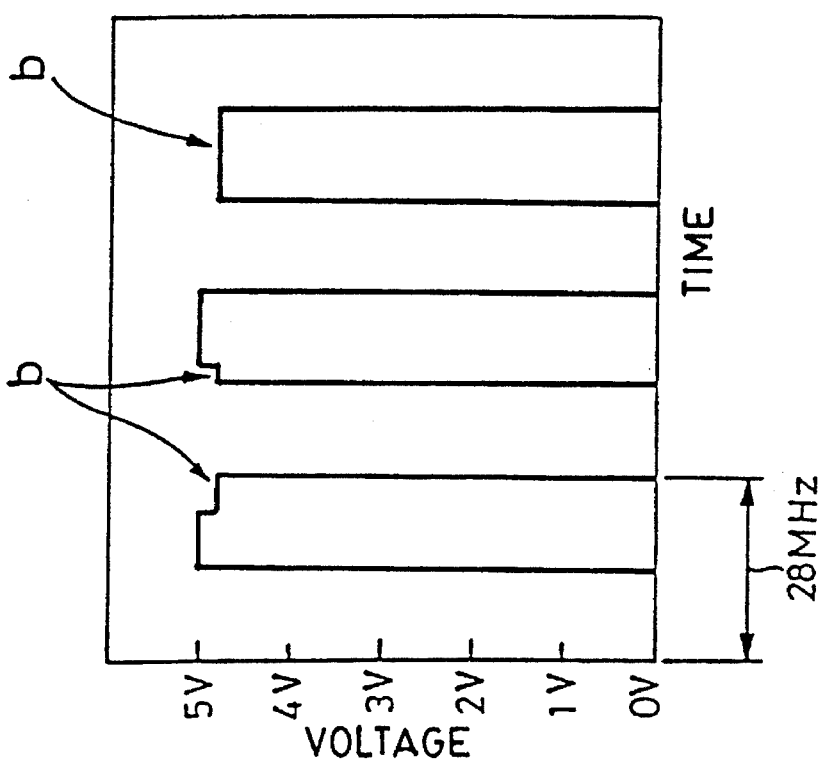
Figure 4:
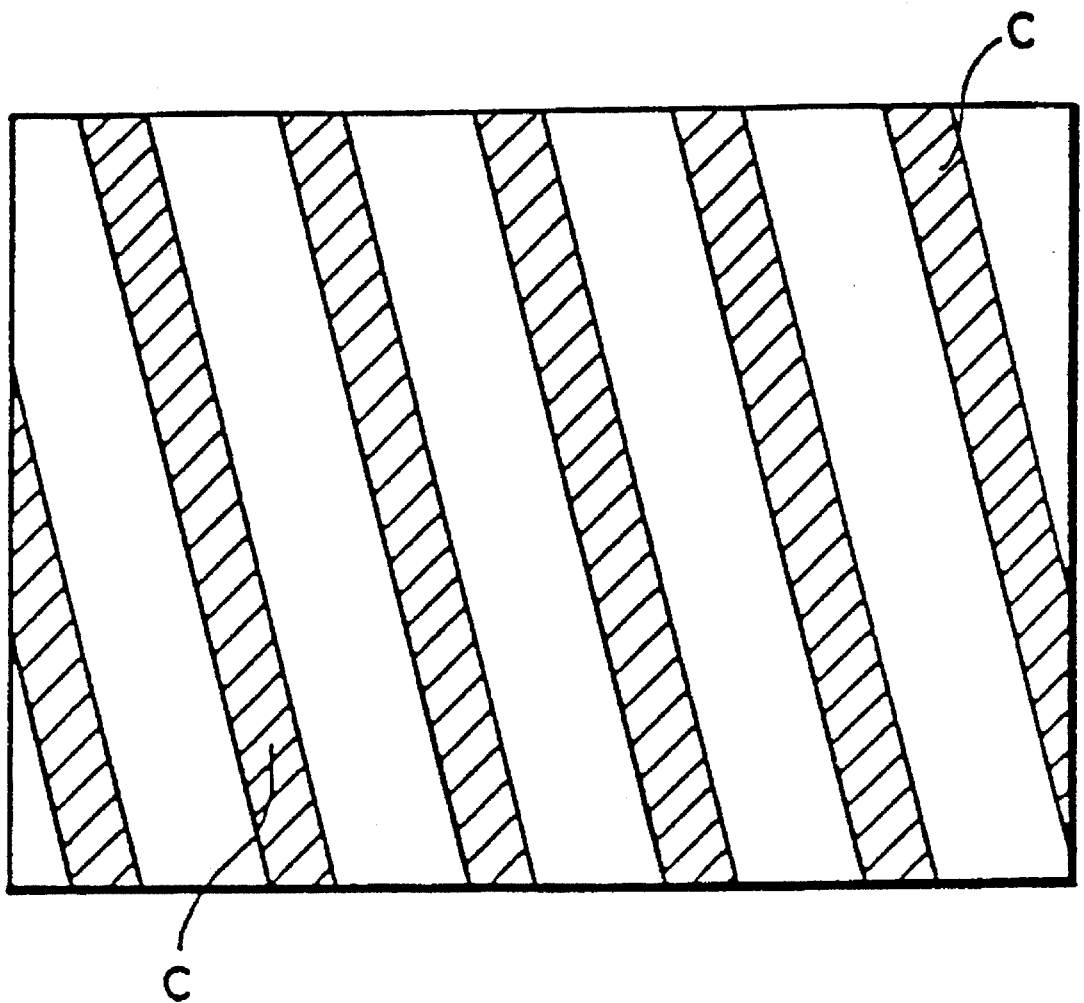
FIG. 4 is a diagram used to explain a deteriorated state of a reproduced picture in the semiconductor integrated circuit.

Since no beat occurs in the output signals of the timing generator 5 and the sync signal generator 4 even when the timing generator 5 and the sync signal generator 4 are fabricated on the same silicon substrate 21n, if the cameraman takes a picture of a white background by the CCD image sensor 1, many stripe patterns c (see FIG. 4) are not caused in the reproduced picture by the influence of beat. Therefore, it is possible to prevent the picture quality of the reproduced picture from being deteriorated by the occurrence of the beat.

Figure 9:
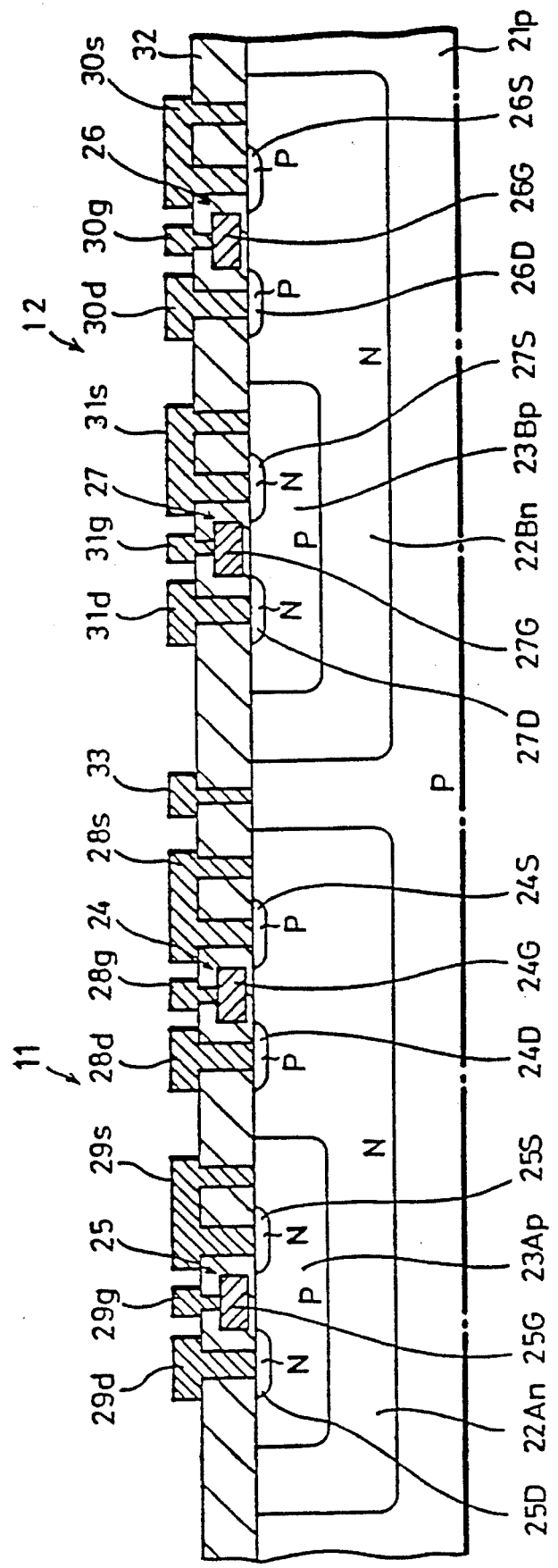
FIG. 9 is a cross-sectional view showing a second embodiment of the present invention showing the FIG. 6 circuit with opposite conductivity types.

The first P-type well region 22Ap and the second P-type well region 22Bp are formed on the N-type silicon substrate 21n, the first N-type well region 23An is formed in the first P-type well region 22Ap, the second N-type well region 23Bn is formed in the second P-type well region 22Bp, the first PMOSFET 24 is formed in the first N-type well region 23An, the first NMOSFET 25 is formed in the first P-type well region 22Ap, the second PMOSFET 26 is formed in the second N-type well region 23Bn and the second NMOSFET 27 is formed in the second P-type well region 22Bp as described above. The present invention is not limited to this structure, however, and the following variation also is possible. As shown in FIG. 9, the first N-type well region 22An and the second N-type well region 22Bn are formed on the P-type silicon substrate 21p, the first P-type well region 23Ap is formed in the first N-type well region 22An, the second P-type well region 23Bp is formed in the second N-type well region 22Bn, the first NMOSFET 25 is formed on the first P-type well region 23Ap, the first PMOSFET 24 is formed in the first N-type well region 22An, the second NMOSFET 27 is formed in the second P-type well region 23Bp and the second PMOSFET 26 is formed in the second N-type well region 22Bn.

Also in this case, the first NMOSFET 25 and the first PMOSFET 24 constitute the first CMOS inverter 11, which is an element of the timing generator 5. The second NMOSFET 27 and the second PMOSFET 26 constitute the second CMOS inverter 12 which is an element of the sync signal generator 4.

Modified examples of the semiconductor integrated circuit according to the present invention will be described below with reference to FIGS. 10 through 15.

Figure 10:
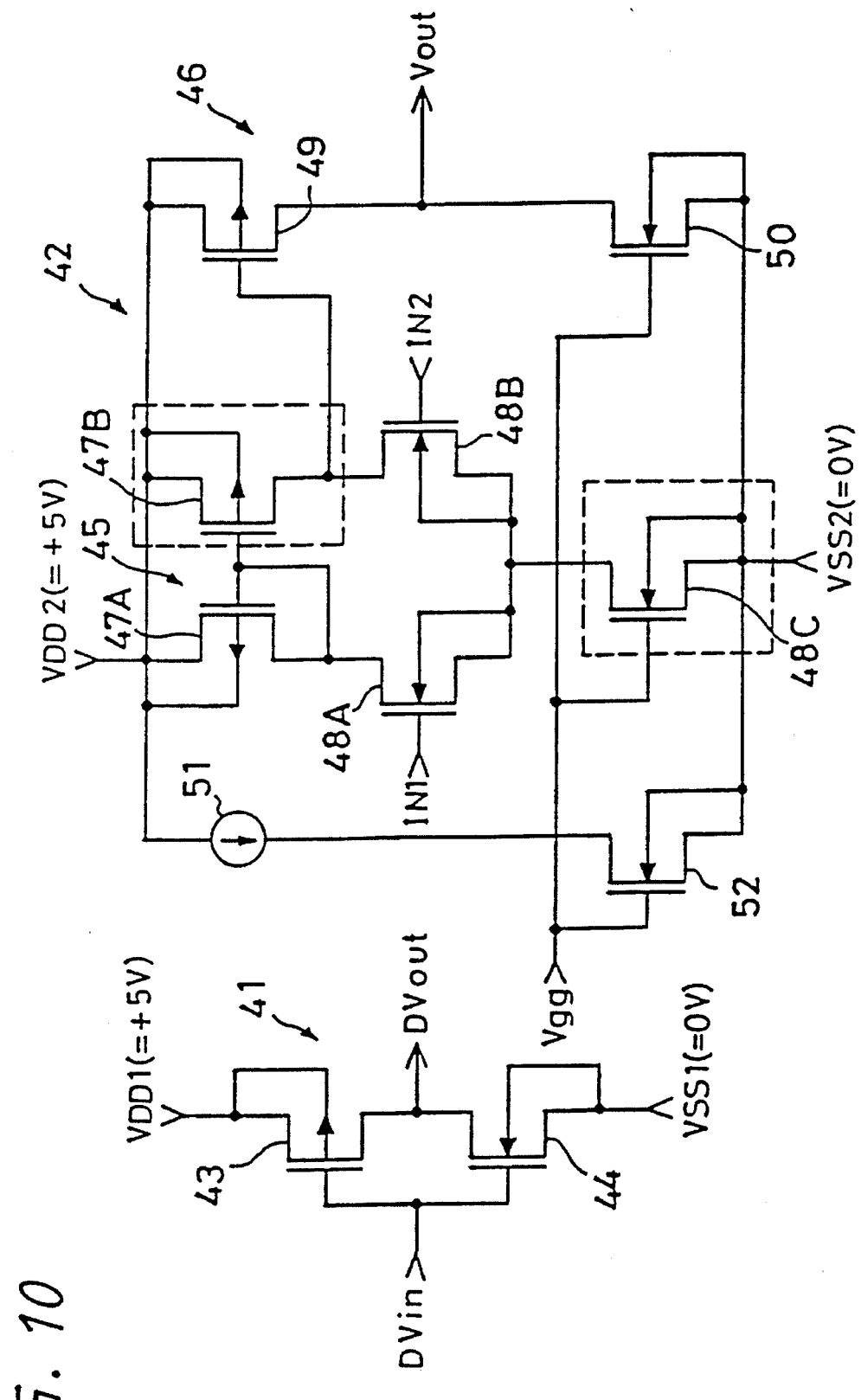
FIG. 10 is a circuit diagram showing a main portion of a semiconductor integrated circuit according to a first modified example of the present invention.

A first modified example will be described with reference to a circuit diagram in FIG. 10. As shown in FIG. 10, a CMOS inverter 41 of the 5 V system, for example, and an operational amplifier circuit 42 of the 5 V system, are fabricated on the same semiconductor substrate.

The CMOS inverter 41 comprises serially-connected PMOSFET 43 and NMOSFET 44 in which a signal DVin representing positive logic or negative logic is applied to the gate electrodes. A supply voltage VDD1 (=+5 V) is applied to the source terminal of the PMOSFET 43 and a supply voltage VSS1 (=0 V) is applied to the source terminal of the NMOSFET 44, respectively. A signal DVout having opposite logic to that of the input logic signal DVin is output from a common drain terminal of the PMOSFET 43 and the NMOSFET 44.

The operational amplifier circuit 42 comprises a current mirror circuit 45 and a source ground circuit 46. The current mirror circuit 45 is composed of a first PMOSFET 47A whose drain terminal and gate electrode are short-circuited, a second PMOSFET 47B whose gate electrode is commonly used by the first PMOSFET 47A, a first NMOSFET 48A connected in series to the first PMOSFET 47A and whose gate electrode is supplied with a first input signal IN1, a second NMOSFET 48B connected in series to the second PMOSFET 47B and whose gate electrode is supplied with a second input signal IN2 and a third NMOSFET 48C connected to a common source terminal of the first and second NMOSFETs 48A and 48B and which forms a constant current source (control voltage Vgg).

The source ground circuit 46 is formed by connecting an output element 49 formed of a PMOSFET and a load resistance element 50 formed of an NMOSFET in series. A circuit that is formed by connecting a constant current source 51 and a load resistance element 52 in series is connected to the front stage of the current mirror circuit 45.

A common supply voltage VDD2 is applied to the source terminals of the first and second PMOSFETs 47A, 47B in the current mirror circuit 45 and the source terminal of the output element 49 in the source ground circuit 46. An output potential (potential at the junction of the second PMOSFET 47B and the second NMOSFET 48B) of the current mirror circuit 45 is supplied to the gate electrode of the output element 49 in the source ground circuit 46.

A constant potential Vgg is applied to the gate electrode of the third NMOSFET 48C forming a constant current source of the current mirror circuit 45 and the gate electrodes of the load resistance element 52 connected to the preceding stage of the current mirror circuit 45 and the load resistance element 50 in the source ground circuit 46. The supply voltage VSS2 (=0 V) is applied to the respective source terminals of the third NMOSFET 48C and the load resistance elements 50 and 52.

Figure 11:
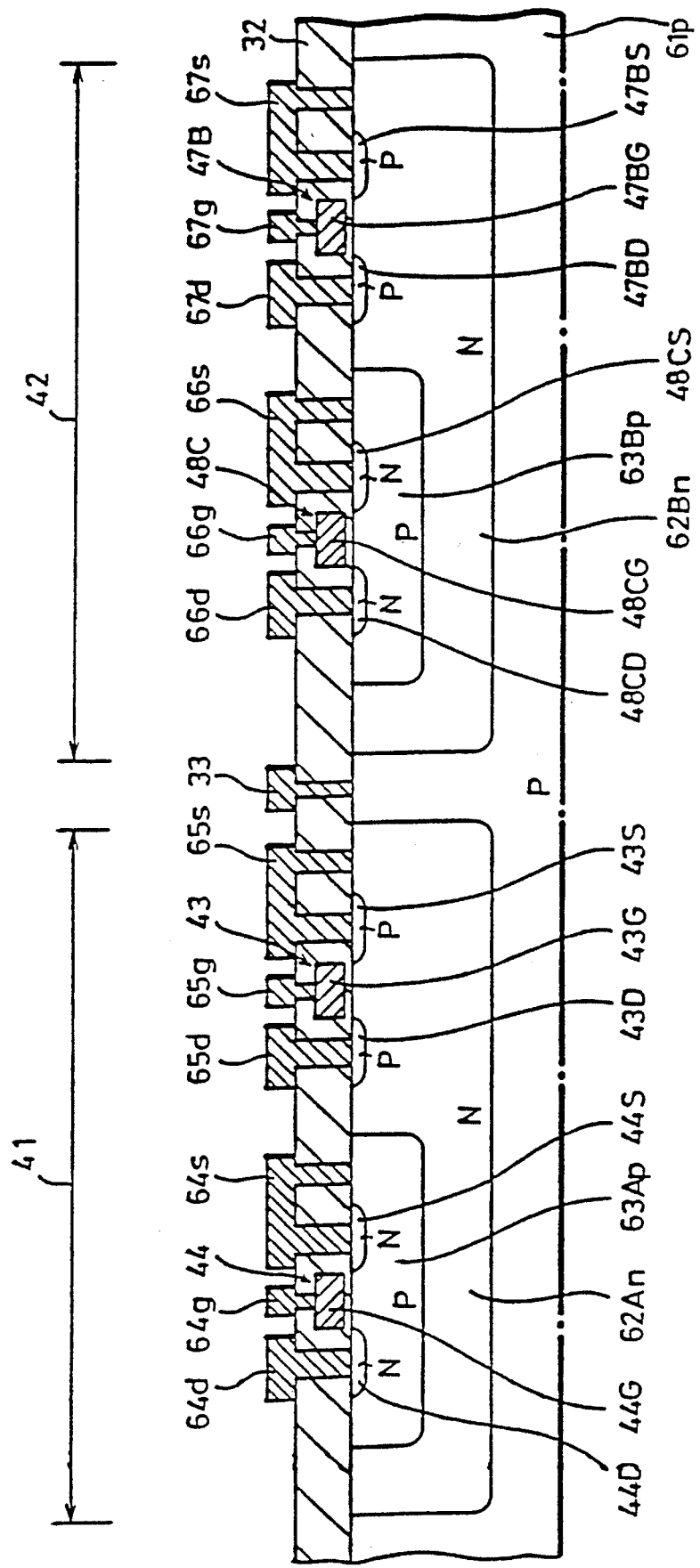
FIG. 11 is a cross-sectional view showing an arrangement of a main portion of the semiconductor integrated circuit according to the first modified example of the present invention.

An arrangement of the semiconductor integrated circuit according to the first modified example of the present invention will be described more fully with reference to a cross-sectional view of FIG. 11. FIG. 11 shows a cross section of a part (the second PMOSFET 47B and the third NMOSFET 48C shown by dashed line blocks in FIG. 10) of the CMOS inverter 41 and the operational amplifier circuit 42 for simplicity.

As shown in FIG. 11, a first N-type well region 62An is formed on a P-type silicon substrate 61p at its portion in which the CMOS inverter 41 is formed. A second N-type well region 62Bn is formed on the P-type silicon substrate 61p at its portion in which the operational amplifier circuit 42 is formed. The first and second N-type well regions 62An and 62Bn are isolated from each other from a plane standpoint.

A first P-type well region 63Ap is formed in the first N-type well region 62An so as to be included on the plane region by the first N-type well region 62An. A second P-type well region 63Bp is formed in the second N-type well region 62Bn so as to be included on the plane by the second N-type well region 62Bn.

In the first N-type well region 62An, an NMOSFET 44 composed of an N-type source region 44S, an N-type drain region 44D each formed by implanting ions of phosphorus (P), for example, and a gate electrode 44G formed of a polycrystalline silicon layer, a tungsten polycide layer or the like is formed in the first P-type well region 63Ap. A PMOSFET 43 composed of a P-type source region 43S, a P-type drain region 43D each formed by implanting ions of boron (B) and a gate electrode 43G formed of a polycrystalline silicon layer, a tungsten polycide layer or the like is formed on regions other than the first P-type well region 63Ap, thereby forming the CMOS inverter 44 composed of the NMOSFET 44 and the PMOSFET 43.

In the second N-type well region 62Bn, a third NMOSFET 48C composed of an N-type source region 48CS, an N-type drain region 48CD each formed by implanting ions of phosphorus (P) and a gate electrode 48CG formed of a polycrystalline silicon layer, a tungsten polycide layer or the like is formed in the second P-type well region 63Bp. A second PMOSFET 47B composed of a P-type source region 47BS, a P-type drain region 47BD each formed by implanting ions of boron (B) and a gate electrode 47BG formed of a polycrystalline silicon layer, a tungsten polycide layer or the like is formed on regions other than the second P-type well region 63Bp, thereby forming the operational amplifier circuit 42 which includes the third NMOSFET 48C and the second PMOSFET 47B.

As shown in FIGS. 10 and 11, an input voltage Vin1 is applied to gate electrodes 64g and 65g of the NMOSFET 44 and the PMOSFET 43 in the CMOS inverter 41. A supply voltage VSS1 is applied to a source electrode 64s which commonly contacts the source region 44S of the NMOSFET 44 and the first P-type well region 63Ap. A supply voltage VDD1 is applied to a source electrode 65s which commonly contacts the source region 43S of the PMOSFET 43 and the first N-type well region 62An. A drain electrode 64d which contacts the drain region 44D of the NMOSFET 44 and a drain electrode 65d which contacts the drain region 43D of the PMOSFET 43 are commonly connected, and an output voltage DVout is obtained from this common terminal.

In the operational amplifier circuit 42, a control voltage Vgg is applied to the gate electrode 48CG of the third NMOSFET 48C. A drive current from the current mirror circuit 45 is supplied to the drain electrode 66d which contacts the drain region 48CD. A supply voltage VSS2 is applied to a source electrode 66s which commonly contacts the source region 48CS and the second P-type well region 63Bp. A drain potential of the first PMOSFET 47A is applied to the gate electrode 47BG of the second PMOSFET 47B. A drain electrode 67d which contacts the drain region 47BD is connected to the gate electrode of the output element 49 in the source ground circuit 46. A supply voltage VDD2 is applied to a drain electrode 67s which commonly contacts the source region 47BS and the second N-type well region 62Bn.

Also, in accordance with the first modified example of the present invention, a path in which the supply voltage VDD1 applied to the source region 43S of the PMOSFET 43 and the first N-type well region 62An is supplied, and a path in which the supply voltage VDD2 applied to the source region 47BS of the second PMOSFET 47B and the second N-type well region 62Bn is supplied, are isolated from each other. Further, a path in which the supply voltage VSS1 applied to the source region 44S of the NMOSFET 44 and the first P-type well region 63Ap is supplied and a path in which the supply voltage VSS2 applied to the source region 48CS of the third NMOSFET 48C and the second P-type well region 63Bp is supplied are isolated from each other.

When the potential DVin input to the NMOSFET 44 of the CMOS inverter 41 is changed from a low to a high level or from a high to a low level so that the NMOSFET 44 is turned on/off, the CMOS inverter 41 outputs a pulse-shaped signal of high and low potentials opposite to those of the input potential in response to the on/off operation of the NMOSFET 44 as shown in FIG. 12A. At that very time, the gate bias potential VSS1 also is fluctuated.

Figure 12B:
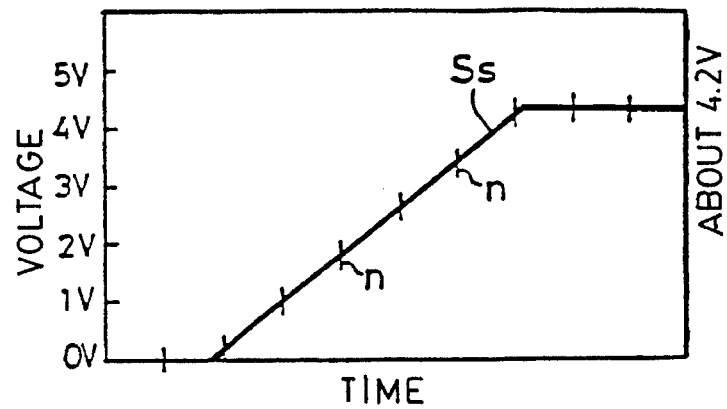
Figure 13:
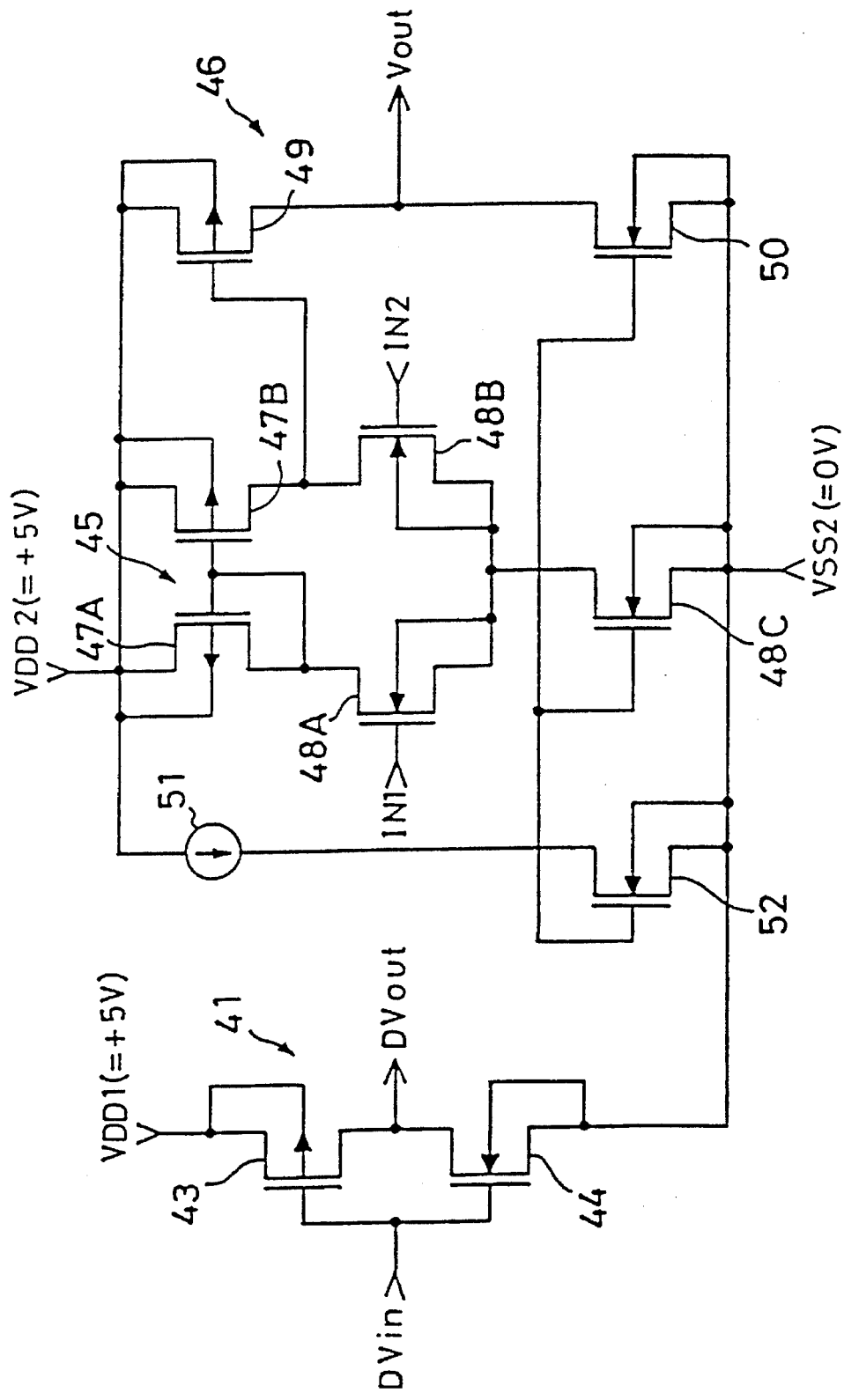
FIG. 13 is a circuit diagram showing ordinary circuit examples of a CMOS inverter and an operational amplifier circuit.

In the ordinary circuit arrangement, as shown in FIG. 13, a path in which the voltage is supplied to the source terminal of the NMOSFET 44 in the CMOS inverter 41 and a path in which the voltage is supplied to the load resistance elements 50, 52 of the operational amplifier circuit 42 and the source terminal of the third NMOSFET 48C are the same and the supply voltage is VSS (=0 V). Therefore, as shown in FIG. 12B, a signal waveform of an output signal output from the operational amplifier circuit 42 becomes such that a noise component n synchronized with the on/off operation of the NMOSFET 44 is superimposed on a regular signal component Ss.

The reason for this is that, when the NMOSFET 44 is turned on/off, the gate bias potential VSS1 is fluctuated and this fluctuation of the gate bias potential VSS1 is transmitted through the supply path (generally the silicon substrate 61p) of the supply voltage VSS. This fluctuation appears as the noise component n.

However, according to the first modified example of the present invention, the supply path of the supply voltage VDD1 and the supply path of the supply voltage VDD2 are isolated from each other. Furthermore, the supply path of the supply voltage VSS1 and the supply path of the supply voltage VSS2 are isolated from each other. Therefore, even when the gate bias potential VSS1 of the NMOSFET 44 is fluctuated, the operational amplifier circuit 42 side can be prevented from being affected by such a fluctuation of the gate bias potential VSS1. Specifically, the reason for this is that the NMOSFET 44 is isolated in potential from the silicon substrate 61p by the first P-type well region 63Ap and the third NMOSFET 48C, which is the element of the operational amplifier circuit 42, also is isolated in potential from the silicon substrate 61p by the second P-type well region 63Bp. In addition, since the gate bias potential in the third NMOSFET 48C is fixed to the potential (supply voltage applied through the source electrode 66s) which is different from the gate bias potential VSS1 of the NMOSFET 44, it is possible to completely remove a potential interference occurring on the third NMOSFET 48C due to the fluctuation of the gate bias potential VSS1 of the NMOSFET 44.

In particular, according to the first modified example of the present invention, since the ground potential is applied through the electrode 33 to the silicon substrate 61p, a neutral region is produced in the pn-junction portions among the first and second N-type well regions 62An, 62Bn and the silicon substrate 61p from a potential standpoint. Owing to the existence of the neutral region, the first N-type well region 62An and the second N-type well region 62Bn are isolated from each other from a potential standpoint, i.e. the CMOS inverter 41 and the operational amplifier circuit 42 are isolated from each other from a potential standpoint. Thus, a potential interference between the CMOS inverter 41 and the operational amplifier circuit 42 can be completely removed.

Accordingly, a signal waveform of the output signal output from the operational amplifier circuit 42 becomes only the regular signal component Ss as shown in FIG. 12C and has no noise component n synchronized with the on/off operation of the NMOSFET 44 as shown in FIG. 12B.

Therefore, it becomes possible to fabricate the logic circuit such as the CMOS inverter 41 and the operational amplifier circuit 42 on the same silicon substrate 61p. Also, it becomes possible to reduce an area in which the circuit system for performing various signal processings is mounted by using the logic circuit 41 and the operational amplifier circuit 42.

A second modified example of the present invention will be described below. According to the second modified example of the present invention, a digital-system circuit having 0 V as a reference voltage and a positive and negative input and output operational amplifier for outputting a difference between a signal input to an inverting input terminal and a signal input to a non-inverting input terminal in a range of from −5 V to +5 V are fabricated on the same semiconductor substrate.

Figure 14:
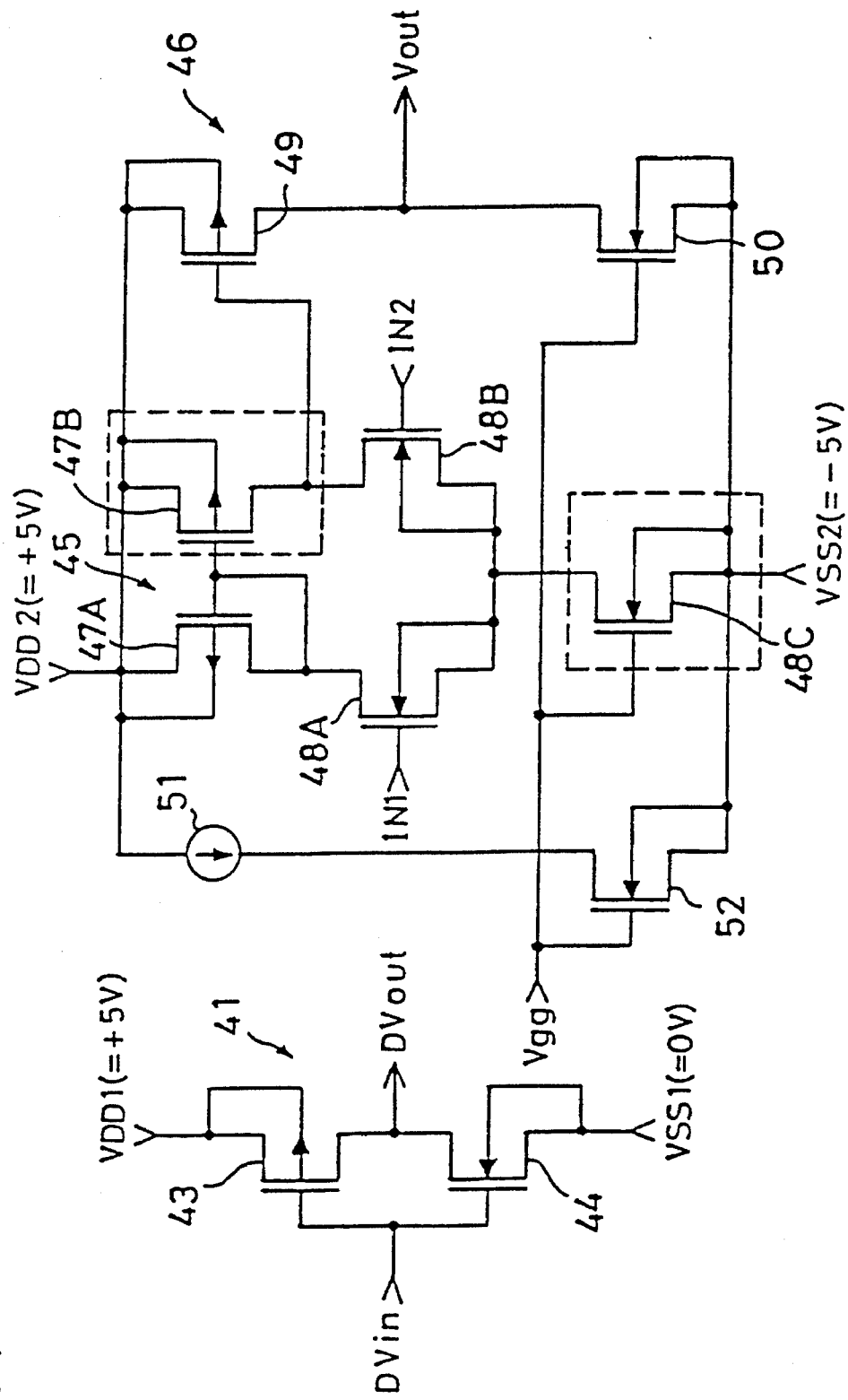
FIG. 14 is a circuit diagram showing an arrangement of a main portion of a semiconductor integrated circuit according to a second modified example of the present invention.
Figure 15:
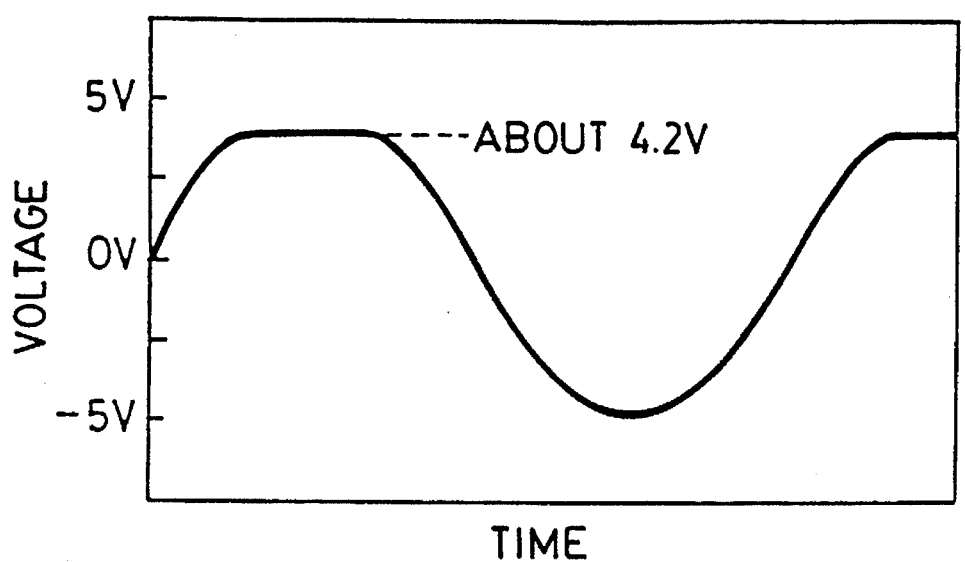
FIG. 15 is a diagram of a waveform of an output signal output from a positive and negative input and output operational amplifier circuit used in the semiconductor integrated circuit according to the second modified example of the present invention.

According to the second modified example of the present invention, as an example of an applicable circuit, as shown in FIG. 14, it is possible to use a circuit example similar to that of the first modified example shown in FIG. 10. The second modified example differs from the first modified example only in that the supply voltage VSS2 of the operational amplifier circuit 42 is −5 V. Accordingly, in the second modified example, like parts corresponding to those of the first modified example are marked with the same reference numerals. A waveform of an output signal output from the positive and negative input and output operational amplifier circuit 42 is presented such that, as shown in FIG. 15, when a gain of the source ground circuit 46 is set to 1, the signal level is changed from −5 V to a difference voltage between +5 V and a threshold value of the PMOSFET.

An arrangement of the semiconductor integrated circuit according to the second modified example of the present invention will be described with reference to the cross-sectional structure of FIG. 11 used in the first modified example. FIG. 11 shows the cross-sectional structure of a part (the second PMOSFET 47B and the third NMOSFET 48C shown by dashed line blocks in FIG. 14) of the CMOS inverter 41 and the positive and negative input and output operational amplifier circuit 42 similarly to the case of the first modified example, for simplicity. Respective electrodes and impurity diffusion regions are the same as those of the first modified example and therefore need not be described in detail.

According to the second modified example of the present invention, the input voltage DVin is applied to the gate electrodes of the NMOSFET 44 and the PMOSFET 43 in the CMOS inverter 41. The supply voltage VSS1 (=0 V) is applied to the source electrode 64s which commonly contacts the drain region 44D of the NMOSFET 44 and the first P-type well region 63Ap. The supply voltage VDD1 (=+5 V) is supplied to the drain electrode 65s which commonly contacts the source region 43S of the PMOSFET 43 and the first N-type well region 62An. The drain electrode 64d which contacts the drain region 44D of the NMOSFET 44 and the drain electrode 65d which contacts the drain region 43D of the PMOSFET 43 are commonly connected and the output voltage DVout is obtained from this common terminal.

In the positive and negative input and output operational amplifier circuit 42, the control voltage Vgg is applied to the gate electrode 48CG of the third NMOSFET 48C and the drive current from the current mirror circuit 45 is supplied to the drain electrode 66d which contacts the drain region 48CD. The supply voltage VSS2 (=−5 V) is applied to the source electrode 66s which commonly contacts the source region 48CS and the second P-type well region 63Bp. The drain potential of the first PMOSFET 47A is applied to the gate electrode 47BG of the second PMOSFET 47B. The drain electrode 67d which contacts the drain region 47BD is interconnected to the gate electrode of the output element 49 in the source ground circuit 46. The supply voltage VDD2 (=+5 v) is applied to the source electrode 67s which commonly contacts the source region 47B and the second N-type well region 62Bn.

Also in accordance with the second modified example of the present invention, the path in which the supply voltage VDD1 applied to the source region 43S of the PMOSFET 43 and the first N-type well region 62An is supplied and the path in which the supply voltage VDD2 applied to the source region 47BS of the second PMOSFET 47B and the second N-type well region 62Bn is supplied are isolated from each other. Further, the path in which the supply voltage VSS1 applied to the source region 44S of the NMOSFET 44 and the first P-type well region 63Ap is supplied and the path in which the supply voltage VSS2 applied to the source region 48CS of the third NMOSFET 48C and the second P-type well region 63Bp is supplied are isolated from each other.

It is customary that the two circuits 41, 42 cannot be fabricated on the same silicon substrate 61p if they do not use a common voltage. However, in the semiconductor integrated circuit according to the second modified example of the present invention, the supply path of the supply voltage VDD1 and the supply path of the supply voltage VDD2 are isolated from each other. Further, the supply path of the supply voltage VSS1 and the supply path of the supply voltage VSS2 are isolated from each other. Therefore, the digital-system circuit (e.g., CMOS inverter 41) which operates at a voltage ranging from 0 V to 5 V and the positive and negative input and output operational amplifier circuit 42 which operates at a voltage ranging from −5 V to +5 V can be fabricated on the same silicon substrate 61p. Thus, it is possible to provide these circuits 41 and 42 as one semiconductor chip. Specifically, it is possible to provide a semiconductor integrated circuit in which a circuit operable as a digital circuit and a circuit operable as an analog circuit can be fabricated as one semiconductor chip. In recent electronic equipment units that tend to become multi-functional, the circuit mounting area tends to increase in accordance with the increase of functions. In this case, if the semiconductor integrated circuit according to the second modified example of the present invention is used, then it is possible to effectively reduce the circuit mounting area.

While the circuits 41 and 42 are fabricated on the P-type silicon substrate 61p in the first and second modified examples, the present invention is not limited thereto and can be applied to the case that the circuits 41 and 42 are fabricated on the N-type silicon substrate 61n. In this case, in the first modified example shown in FIG. 11, the circuits 41 and 42 may be fabricated on the N-type silicon substrate 61n under the condition that their polarities are inverted.

As described above, according to the semiconductor integrated circuit of the present invention, since the supply path for supplying drive voltages to a plurality of circuit blocks to which reference clock signals having different frequencies are input are isolated from each other, the plurality of circuit blocks to which the reference clock signals having different frequencies are input can be fabricated on the same substrate.

Further, according to the semiconductor integrated circuit of the present invention, since the first well region of conductivity type different from that of the semiconductor substrate is formed on the semiconductor substrate, the second well region of the same conductivity type as that of the semiconductor substrate is formed in the first well region, the circuits mainly formed of FETs are formed in the well regions, and the circuits respectively formed in the first and second well regions constitute one circuit block, a plurality of circuit blocks are isolated by the first well region, and the voltage supply paths can be isolated and interconnected at every first well, i.e. at every circuit block.

Furthermore, according to the semiconductor integrated circuit of the present invention, since the two circuit blocks are formed on the semiconductor substrate, one circuit block of the two circuit blocks is used as the timing generator for generating the vertical transfer pulse and the horizontal transfer pulse used to transfer charges of the solid state imaging device, and the other circuit block is used as the sync signal generator for generating the reference pulse signal that is used by the timing generator to generate the vertical transfer pulse and the horizontal transfer pulse. Even when the timing generator and the sync signal generator for generating the drive pulse of the CCD image sensor are fabricated on the same substrate, no beat occurs in the output signals output from the timing generator and the sync signal generator and the picture quality of the reproduced picture can be prevented from being deteriorated. This makes it possible to fabricate the timing generator and the sync signal generator on the same substrate. Therefore, it is possible to miniaturize the electronic equipment in which the CCD image sensor is mounted from a circuit mounting standpoint.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

I claim as my invention:

1. A semiconductor integrated circuit, comprising:

a first circuit block comprising first and second field effect transistors (FETs) connected in series having a first supply voltage input and a first supply voltage return and a first signal input and a first signal output, the first signal input having connected thereto an input signal having a first frequency;

a second circuit block comprising third and fourth FET transistors connected in series and having a second supply voltage input independent of the first supply voltage input and a second supply voltage return independent of the first supply voltage return, and a second signal input and second signal output, and said second signal input having an input signal of a second frequency connected thereto, said first and second frequencies differing from each other;

a semiconductor substrate containing in common said first through fourth field effect transistors, said substrate being of a first conductivity type and containing first and second spaced apart well regions of a second conductivity type at a surface thereof, and an electrode connected to the substrate for application of a substrate potential for creation of a potential neutral region in the substrate between the first and second well regions;

said first well region containing said first field effect transistor in a first additional well region of first conductivity type, and said second field effect transistor being positioned along side said first additional well region in said first well region of second conductivity type;

said second well region of said second conductivity type containing said third field effect transistor in a second additional well region of first conductivity type, and said fourth field effect transistor being positioned along side said second additional well region in said second well region of second conductivity type;

said first well region of second conductivity type being directly connected to said first supply voltage return and said second well region of second conductivity type being directly connected to said second supply voltage return so that the supply voltage returns of the first and second circuit blocks are isolated from each other and a potential fluctuation caused by the first signal input of the first frequency in the first well region does not effect operation of the second circuit block, and potential fluctuations caused by the second signal input of said second frequency in said second circuit block is isolated from the first circuit block;

the first and second field effect transistors of the first circuit block being part of a timing generator of a CCD (charge coupled device) image sensor system, and said third and fourth field effect transistors being part of a sync signal generator of the same CCD image sensor system; and said timing generator providing vertical and horizontal transfer clock signals to a CCD image sensor of said system based on a sync signal supplied to said timing generator from said sync signal generator, said sync signal generator providing a timing signal to a signal processor receiving signals from said CCD image sensor, and said isolation of the first and second supply voltage returns preventing a beat (a wave form distortion) from developing in an output image of said signal processor.

* * * * *